United States Patent [19]

Imme

[11] Patent Number: 5,073,958
[45] Date of Patent: Dec. 17, 1991

[54] METHOD OF DETECTING EDGES IN IMAGES

[75] Inventor: Martin W. Imme, Hamburg, Fed. Rep. of Germany

[73] Assignee: U.S. Philips Corporation, New York, N.Y.

[21] Appl. No.: 556,782

[22] Filed: Jul. 11, 1990

[30] Foreign Application Priority Data

Jul. 15, 1989 [DE] Fed. Rep. of Germany ....... 3923449

[51] Int. Cl.⁵ .............................................. G06K 9/48
[52] U.S. Cl. ........................................ 382/22; 382/62; 307/351
[58] Field of Search ............................ 382/22, 60, 62; 307/351, 517; 328/114, 132

[56] References Cited

U.S. PATENT DOCUMENTS

| | | | |
|---|---|---|---|
| 4,501,016 | 2/1985 | Persoon et al. | 382/22 |
| 4,772,128 | 9/1988 | Vinarub et al. | 356/384 |
| 4,790,027 | 12/1988 | Scherl | 382/54 |

OTHER PUBLICATIONS

L. S. Davis, "A Survey of Edge Detection Techniques", Computer Graphics and Image Processing, vol. 4, No. 3, Sep. 1975, pp. 248-270.

Primary Examiner—Leo H. Boudreau
Assistant Examiner—Steven P. Klocinski
Attorney, Agent, or Firm—William Squire

[57] ABSTRACT

An image matrix of an image to be filtered is scanned in four different directions, i.e. row-wise, column-wise and also in the two diagonal directions, and in all pixel sequences scanned local maxima and minima are determined. From these values the actual grey-level variation in the non-filtered image is approximated by way of a function which includes an inflection point, for example a sine function. The approximation is realized, for example, according to the least error squares method; the inflection point indicates a point of an edge. Interruptions in the course of the edges as well as shifts with respect to the actual image are thus avoided.

15 Claims, 2 Drawing Sheets

METHOD OF DETECTING EDGES IN IMAGES

FIELD OF THE INVENTION

The invention relates to a method of detecting edges in images which occur as grey-levels of pixels arranged in a two-dimensional image matrix, the grey-level variations of the image matrix being filtered by means of an operator and edges being detected in the filtered image matrix by combination of the grey-levels of several neighboring pixels.

BACKGROUND OF THE INVENTION

Methods of this kind are known, for example from the article by L. S. Davis "A Survey of Edge Detection Techniques" in "Computer Graphics and Image Processing" 1975, No. 4, pp. 248-270. Such methods use various linear or non-linear operators which offer various advantages and involve a different arithmetical complexity. Notably when real images which are degraded by noise and interference signals are used, the various methods offer different results. Such images may be, for example X-ray images or images obtained by magnetic resonance imaging. In practical images a problem occurs in that edges cannot be defined exactly to one point or a more or less strict sequence of individual pixels, and on the other hand the known methods often cause gaps in the detected edges. i.e. non-contiguous contours.

SUMMARY OF THE INVENTION

Therefore, it is the object of the invention to provide a method of the kind set forth enabling detection of a continuous edge which contains as few gaps as possible in an exact as possible location corresponding to the real image.

This object is achieved in accordance with the invention in that in a filtered image matrix local minima and maxima of the grey levels are determined and stored separately in four directions which extend at an angle of 45° with respect to one another. After determination of all maxima and minima in the filtered image matrix, the actual grey-level variation in the relevant direction is approximated between each minimum and a neighboring maximum in the non-filtered image matrix by way of a predetermined function having an inflection point, the location of the inflection point representing a point of an edge searched.

As a result of the examination of the image in four different directions, i.e. substantially in the horizontal direction, the perpendicular direction as well as in the two diagonal directions, each less pronounced edge is also found in the direction which extends substantially perpendicular to this edge. Furthermore, because the exact location of the actual edge is searched in the real, non-filtered image, shifts due to the filtering process are eliminated. In practically all cases continuous, non-interrupted edges are thus detected. First all maxima and minima can be determined in the filtered image, after which the edge points are determined in the non-filtered image, or the relevant edge point is determined for each pair consisting of a maximum and minimum.

The function used for approximating the real grey-level variation may have an arbitrary form for as long as it comprises a zone including an inflection point. In accordance with a first version of the invention, it is particularly useful to use a sine function for this purpose. In a further version of the invention, an arctg function is used. The sine function is preferably used over one half period from one minimum to the subsequent maximum; a corresponding zone which is symmetrical with respect to the inflection point is used for the arctg function. Other functions, i.e. odd higher-order polyomials, can also be used.

The approximation of the grey level variation in the real image can be realized in various ways. The least-squares error method is effective in this respect.

Using the method in accordance with the invention, the edges in the image are pixel-wise detected. Even more accurate detection is possible in that in accordance with a further version of the invention an indication as regards the direction of the edge is derived from the slopes of the approximative functions for all directions in which this function exhibits an inflection point at an edge point. These indications concerning the direction of the edge can be used for further evidence.

IN THE DRAWING

Versions in accordance with the invention will be described in detail hereinafter with reference to the drawing. Therein:

FIG. 1 diagrammatically shows an image matrix with the scanning directions.

DESCRIPTION OF THE PREFERRED EMBODIMENT

Figure 1:
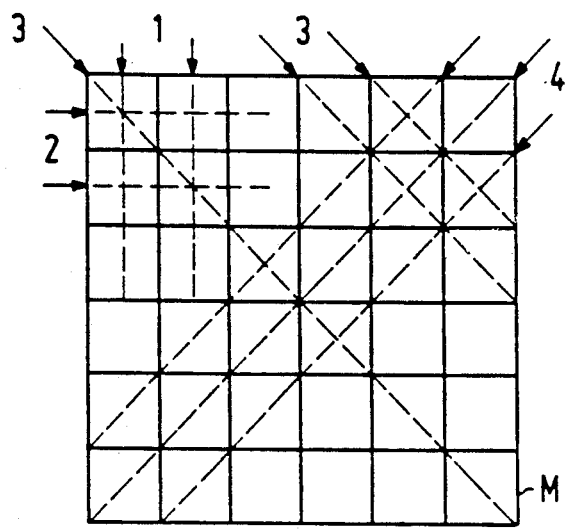

FIG. 1 shows an image matrix M which consists of a number of pixels which are arranged in rows and columns, each square being assumed to represent one pixel. Each pixel has a given grey-level which is represented by a multi-digit binary number. It will be evident that in practice the image matrix M comprises a number of pixels which is far greater than that shown in FIG. 1.

Because noise and other interference signals are inevitably superposed on the variation of the grey-levels in an image, liable to simulate false edges, the variation of the grey-levels in the image must first be smoothed. To this end, preferably two-dimensional smoothing is applied, for example in a customary manner according to a two-dimensional Gaussian curve. The standard deviation of the Gaussian curve is chosen so that the interference signals are eliminated to a high degree, without excessively pairing down steep edges or closely adjoining edges.

It is assumed that the image matrix M shown in FIG. 1 contains the smoothed grey-level variation. This matrix is scanned in various directions, that is to say column-wise in the direction of the arrows 1, row-wise in accordance with the arrows 2, and also in the two diagonal directions corresponding to the arrows 3 and 4, only a part of the scanned rows and columns and diagonals being denoted by arrows for the sake of clarity.

It is to be noted that these scans, of course, are not performed in a real image but in the series of grey-levels of the image which are stored in an electronic memory, the smoothing or filtering also being performed on stored image signals.

Figure 2:
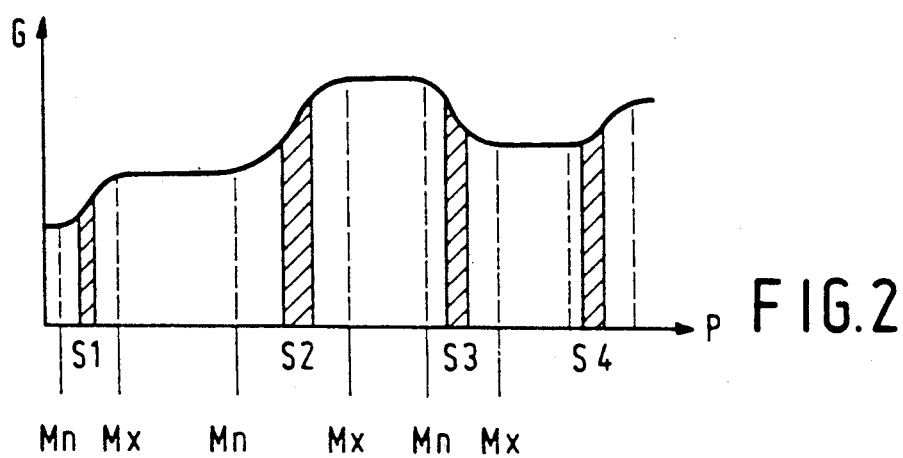
FIG. 2 shows the variation of the grey levels during a scan of the image matrix in one of the directions.

Thus, in each direction there are obtained series of grey-levels, an example of the grey-levels G of a scanning row of pixels P being shown in FIG. 2. The series of discrete grey-levels actually present is represented therein as a non-interrupted curve for the sake of simplicity.

In this curve the local minima Mn and maxima Mx are determined in a customary manner. Between each minimum and maximum pair (or vice versa) there is a zone S1, S2, S3 or S4 in which an edge is intersected at a more or less acute angle.

Figure 3:
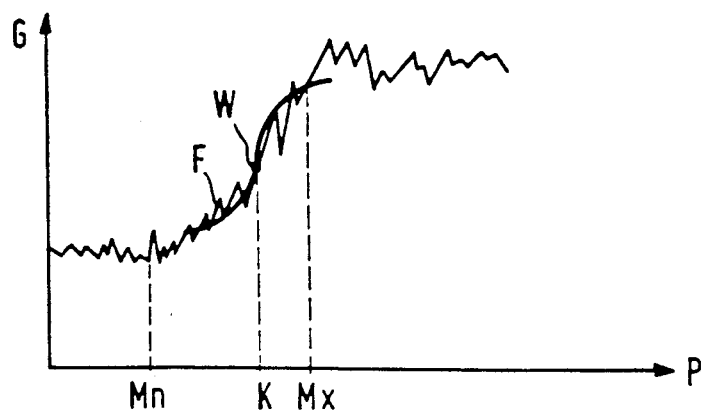
FIG. 3 shows the approximation of the actual image at the area of an edge by a predetermined function.

In order to determine the exact location of this edge, between the minimum Mn and the maximum Mx, i.e. between the associated pixels P, the grey-level variation in the actual image degraded by noise and interference is approximated by a curve which includes an inflection point as indicated in FIG. 3. FIG. 3 shows, by way of example, a grey-level variation expanded over the pixels P, which grey-levels are shown in smoothed form in FIG. 2. The curve F, intended to approximate the actual grey-level variation, is, for example a sine function between the minimum and the maximum, but it is also possible to use, for example arctg function in a predetermined zone. The function F is modified and shifted in the direction of the grey-levels G and in the direction of the pixels P so that the mean square of the error of the deviations of the grey-levels of the interference-degraded image of this function becomes a minimum. When this has taken place, the inflection point W of the function F indicates the location, i.e. the pixel K, in which the edge of a contour is situated in the relevant image zone. This prevents a shift of the filtered image, or the grey-level variation derived therefrom, with respect to the non-filtered image, i.e. the edge is detected in the location where it is most likely present in the original image.

When an edge in the image, and hence also in the filtered image, is intersected in different directions, an edge is obtained in essentially the same pixel for the relevant directions. The slope of this edge, however, depends on the direction in which the edge is intersected, i.e. perpendicularly to the edge the steepest grey-level variation occurs. The slope of the grey-level variation at the area of the edge is then contained in the slope of the function F approximating the grey-level variation and results from the slope of this function at the inflection point, from the amplitude and from the period of this function F. From the slopes of the functions of the various directions in a pixel point detected to be an edge point, the direction of the edge can thus be determined. This direction can also be used for more accurate detection of the edge, if desired, for example by elimination of ambiguities.

Figure 4:
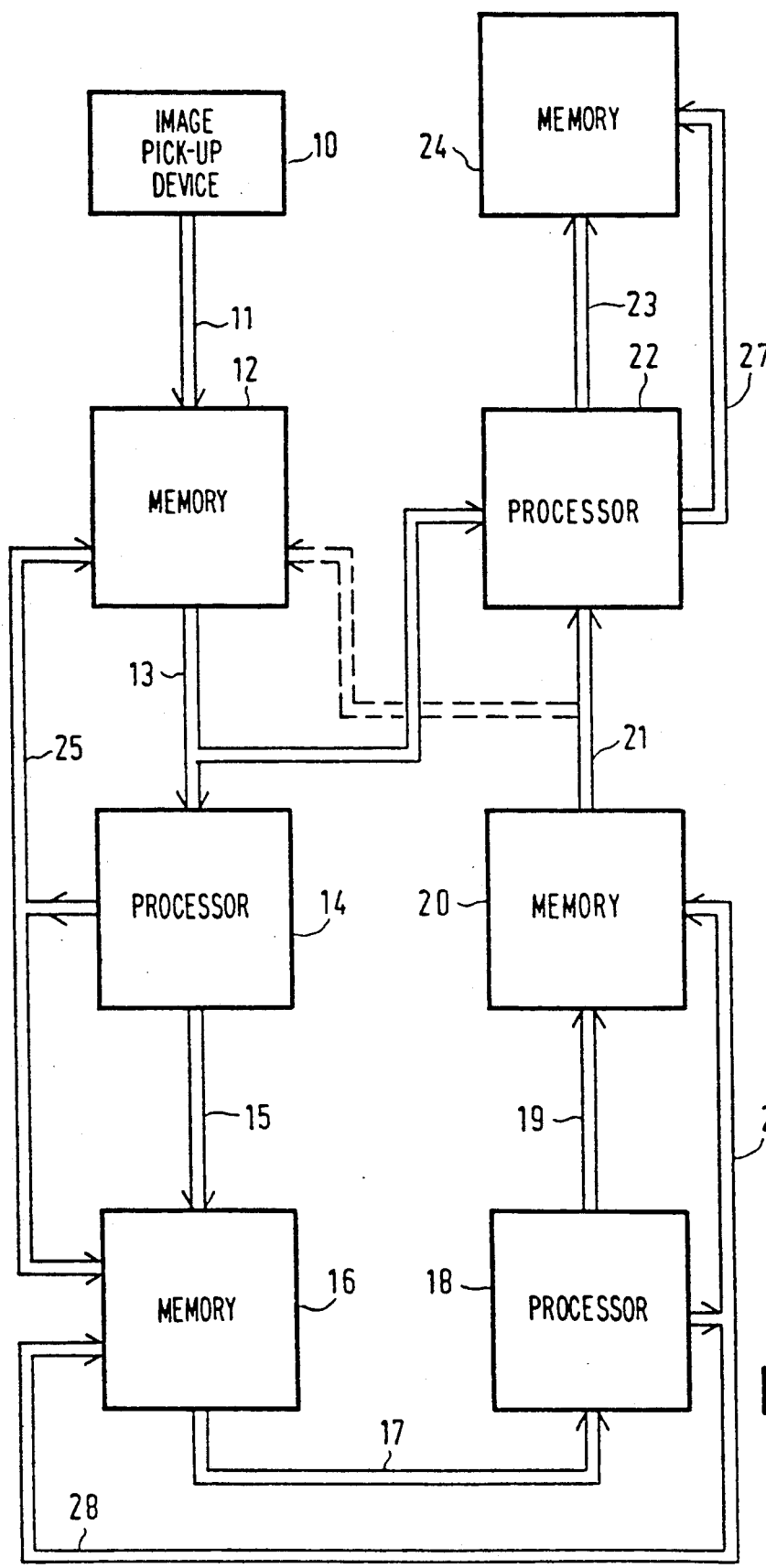
FIG. 4 shows a system for detecting edges in images according to the invention.

The system for edge detection as is shown in FIG. 4 comprises four memories 12, 16, 20 and 24, three processors 14, 18 and 22 and an image pick-up device 10. The image pick-up device 10 scans a picture in which edges are to be detected, for instance an X-ray picture, in a point-like manner and digitizes the grey scale values corresponding to the points. The digitized grey scale values are sent to a memory 12 over an interconnection 11, in which memory the grey scale values are stored according to matrix of image points in which the picture has been picked up by the image pick-up device 10. The grey scale values stored in the memory 12 are afflicted with noise and disturbances. After a complete picture has been stored, a processor 14 addresses each part of the picture matrix and performs a filtering operation, preferably using a two-dimensional Gaussian function, on the grey scale values that are transmitted from memory 12 through an interconnection 13. The filtered grey scale values are loaded into a second memory 16 through an interconnection 15, that is, a grey scale value of an image point in the memory 12 corresponds with a grey scale value of an image point in the memory 16 that has been filtered by combining it with the grey scale values of its neighboring image points. For this purpose both memories 12 and 16 are addressed by the processor 14 through the interconnection 25.

After filtering of the picture to be examined, an extreme value device 18 reads the filtered grey scale values from the memory 16 through an interconnection 17 and addresses the memory 16 through an interconnection 28 in a sequence of four series of addresses that correspond to the four directions in the picture matrix as is shown in FIG. 1. The series of grey scale values that have been read from the memory 16 through the interconnection 17 are searched for maxima and minima in the extreme value device 18, an image point exhibiting a maximum when its grey scale value is larger than the preceeding and the following grey scale value within the series. If desired, pronounced extreme values can be determined by attributing an extreme value to an image point only in the case when the grey scale value in the image point differs from the grey scale value of its neighbors by a predetermined value.

When a maximum or minimum grey scale value has been found, a marker value is written into a memory 20 through an interconnection 19, the memory 20 having a capacity corresponding to approximately four picture matrixes; one picture matrix for each direction of search. Each memory space has only a capacity of 2 bits for storing the marker value that can indicate a maximum, a minimum or none of either. The memory 20 is addressed by the extreme value device 18 through interconnection 28, there being four groups of addresses, each corresponding to a direction of search.

As an alternative, the memory 20 can be arranged such as to contain a coordinate of the image point, an indication of a maximum or minimum and a direction in which the maximum or the minimum has been found. Since most of the image points do not exhibit an extreme value, less memory cells are required, but each memory cell must be able to store a larger number of bits.

In the following it is assumed that first all the maxima and minima are determined in the filtered picture matrix after which the edges are determined in the unfiltered picture matrix. An approximating unit 22 reads the memory 20 and coordinates of image points situated between two neighboring extreme values are sent as address values through the interconnection 21 to the memory 12 containing the unfiltered picture matrix, new series of grey scale values corresponding to the address values being sent to the approximating unit 22 through interconnection 13. Each series of grey scale values of image points situated between two extreme values is approximated by the approximating unit 22 by a function having an unambiguous point of inflection such as a sine-function or an arctg-function, the approximation being efficiently performed by the method of least squares. When an optimally approximated function has been obtained, the point of inflection of this function is an image point the coordinates of which are sent as address values to a memory 24 through an interconnection 27 by the approximating unit 22, marker values being sent to the memory 24 through interconnection 23 for each address value. If desired, the grey scale values of the image points can in addition to the marker values be written into the memory 24 through the interconnection 13, the memory 24 in that case containing the original image with marked edges. The contents of the memory 24 can be made visible on an imaging device, for instance a television monitor.

It is obvious that the processor 14 for filtering the image, the extreme value device 18 and the approximating unit 22 can be realized in one computer calculating and signal processing unit. The memories 12, 16 and 20 can be parts of one single large memory.

What is claimed is:

1. A method of detecting edges in an image which occur as grey levels of pixels in a two-dimensional image matrix comprising:
    electronically filtering said grey levels to produce a filtered matrix having local minima and maxima;
    determining the filtered matrix local minima and maxima of the grey levels in four directions over the image at an angle of 45° with respect to one another;
    approximating the grey level variation in each direction between each maxima and minima in the nonfiltered image matrix employing a predetermined function having an inflection point; and
    determining the location of said inflection point to detect the position of an edge in said image.

2. A method as claimed in claim 1 wherein the predetermined function is a sine function.

3. A method as claimed in claim 1 wherein the predetermined function is an arctg function.

4. A method as claimed in claim 1 including deriving an indication concerning the direction of the edge from the slopes of the approximated functions for all directions in which the approximated functions exhibit an inflection point defining an edge point.

5. A method as claimed in claim 2 including deriving an indication concerning the direction of the edge from the slopes of the approximated functions for all directions in which the approximated functions exhibit an inflection point at an edge point.

6. A method as claimed in claim 3 including deriving an indication concerning the direction of the edge from the slopes of the approximated functions for all directions in which the approximated functions exhibit an inflection point at an edge point.

7. The method of claim 1 including separately storing the determined filtered matrix local maxima and minima for each direction.

8. A system for detecting edges in images, comprising:
    a memory for storing grey-levels associated with pixels arranged in a two-dimensional image matrix; and
    a computer connected to the memory for the filtering of the grey-levels and for storing the filtered grey-levels in memory locations which are arranged as a two-dimensional filtered image matrix, the computer including means for determining and storing local minima and maxima of the grey-levels separately in four directions which extend at an angle of 45° with respect to one another in the filtered image matrix, means to approximate the actual grey-level variation in the relevant direction between each minimum and a neighboring maximum in the non-filtered image matrix, after determination of all maxima and minima in the filtered image matrix employing a predetermined function having an inflection point, and means for storing the location of the inflection point representing a point of an edge searched.

9. A system as claimed in claim 8 wherein the predetermined function is a sine function.

10. A system as claimed in claim 8 wherein the predetermined function is an arctg function.

11. A system as claimed in claim 9, including means for causing the computer to derive an indication concerning the direction of the edge from the slopes of the approximated functions for all directions in which the approximated functions exhibit an inflection point at an edge point.

12. A system as claimed in claim 10, including means for causing the computer to derive an indication concerning the direction of the edge from the slopes of the approximated functions for all directions in which the approximated functions exhibit an inflection point at an edge point.

13. A system as claimed in claim 8, wherein the computer includes means for deriving an indication concerning the direction of the edge from the slopes of the approximated functions for all directions in which the approximated functions exhibit an inflection point at an edge point.

14. A system for detecting edges in an image which occur as grey levels of pixels in a two-dimensional image matrix comprising:
    means for electronically filtering said grey levels to produce a filtered matrix having local maxima and minima;
    means for determining the filtered matrix local minima and maxima of the grey levels in four directions over the image at an angle of 45° with respect to one another;
    means for approximating the grey level variation in each direction between each maxima and minima in the nonfiltered image matrix employing a predetermined function having an inflection point; and
    means for determining the location of said inflection point to detect the position of an edge in said image.

15. The system of claim 14 including means for separately storing the determined filtered matrix local maxima and minima for each direction.

* * * * *